United States Patent [19]
Ferrant

[11] Patent Number: 5,973,985
[45] Date of Patent: Oct. 26, 1999

[54] DUAL PORT SRAM CELL HAVING PSEUDO GROUND LINE OR PSEUDO POWER LINE

[75] Inventor: Richard J. Ferrant, Saint Ismier, France

[73] Assignee: STMicroelectronics, Inc., Carrollton, Tex.

[21] Appl. No.: 09/132,565

[22] Filed: Aug. 11, 1998

[51] Int. Cl.$^6$ ...................................................... G11C 8/00
[52] U.S. Cl. .................... 365/230.05; 365/156; 365/154; 365/226; 365/222
[58] Field of Search ................................... 365/156, 154, 365/230.05, 226, 222

[56] References Cited

U.S. PATENT DOCUMENTS

| | | | |
|---|---|---|---|
| 5,260,908 | 11/1993 | Ueno | 365/230.05 |
| 5,379,260 | 1/1995 | McClure | 365/201 |

*Primary Examiner*—Andrew Q. Tran
*Attorney, Agent, or Firm*—Theodore E. Galanthay; Lisa K. Jorgenson; Jeffrey K. Weaver

[57] ABSTRACT

Disclosed is a multiport SRAM cell. The cell state may be switched by controlling the potential on a single bit line only. A true dual port SRAM cell (in which the two ports may be accessed nearly simultaneously without needing peripheral arbitration logic) employs two cross-coupled inverters, two bit lines, two word lines, and two access transistors. The SRAM cells employ internal "pseudo inverters" that can be independently powered on and off. By powering one of them off during the write operation, the internal conflict associated with changing the value of a stored bit is avoided. Each pseudo inverter may be powered on and off via a pseudo ground or a pseudo Vdd line which controls the potential to locations where ground or Vdd are normally supplied to CMOS inverters.

25 Claims, 4 Drawing Sheets

DUAL PORT SRAM CELL HAVING PSEUDO GROUND LINE OR PSEUDO POWER LINE

BACKGROUND OF THE INVENTION

The present invention relates to dual-port static random access memory (SRAM) cells. More particularly, the invention relates to dual-port SRAM cells having mono-bit line operation on each port and inverters coupled to local pseudo-ground lines.

Dual Port SRAMs ("DPSRAMs") find widespread use in the electronics industry. Conventional DPSRAMs employ either an 8-transistor cell or a 6-transistor cell. Each has its own advantages and disadvantages. Generally, 6-transistor cells are compact but they operate more slowly. The 8-transistor cells operate faster (they are true dual port cells employing a separate word line for each port), but they occupy more space.

Conventional 6-transistor DPSRAMs require only four N channel transistors, two P channel transistors, and two metal bit lines running on top of the cell. A conventional 6-transistor DPSRAM is illustrated in FIG. 1. It operates as follows.

In standby mode, an SRAM cell 2 statically holds a bit value on two cross-coupled CMOS inverters 4 and 6. The output of inverter 4 feeds the input of inverter 6 and the output of inverter 6 feeds the input of inverter 4. Thus, a first logical bit value is held on the left side of cell 2 and the complementary value is held on the right side of the cell. During standby ode, no information is being read from or written cell 2. Thus, access to the cell is blocked. This is accomplished by holding two NMOS access transistors 8 and 10 in a non-conductive state. One source/drain diffusion of transistor 8 is connected to the left port of cell 2 and one source/drain diffusion of transistor 10 is connected to the right port of cell 2. The other source/drain diffusion transistor 8 is connected to a bit line 14 and the other source/drain diffusion of transistor 10 is connected to a bit line 16. In addition, a word line 12 is connected to the gates of both access transistors 8 and 10 and thereby controls the gate potential of both of these transistors. During standby mode, the potential on a word line 12 is held below the threshold voltage of NMOS transistors 8 and 10.

During read mode, bit lines 14 and 16 are initially precharged to an intermediate potential such as Vdd/2, for example. Then, access transistors 8 and 10 are switched on by applying a potential above the threshold voltage to word line 12. At that point, the voltage on the bit lines changes to reflect the value stored on cross-coupled inverters 4 and 6. Assume, for example, that the left side of the cross-coupled inverters has a "high" value ("1") and the right side has a "low" value ("0"). In that case, when access transistors 8 and 10 are turned on, the potential on bit line 16 drops from Vdd/2 to approximately 0. Concurrently, the potential on bit line 14 increases from Vdd/2 to a higher value. That higher value is not quite Vdd ("1"). Rather, because of the body effect associated with NMOS transistor 8, the potential on bit line 14 increases to at most Vdd-Vt. Vt is the threshold voltage of NMOS transistor 8.

While word line 1 is set of Vdd (or other value over the threshold voltage of the NMOS transistors), a sense amplifier detects and compares the voltages on bit lines 14 and 16. From this comparison, it can determine what value is stored on cell 2.

During the write operation, bit lines 14 and 16 are set at complementary voltages. For example, if bit line 14 is set to a high voltage, bit line 16 is set to a low voltage, or vice versa. Assuming for the moment that the cell is storing the low value on the left side and a high value on the right side and that a new value is to be written in which the low value is on the left side and the high value is on the right side, than a low value (0) is applied to bit line 14 and a high value (Vdd) is applied to bit line 16. Then, word line 12 is set to Vdd so that access transistors 8 and 10 are switched on. On the left side of cell 2, the 0 is transferred to the cross-coupled inverters essentially at the level of 0. On the right side, however, the value of Vdd (high) is not transferred at that level. Rather, the transfer potential will at most be Vdd-Vt because of the body effect as explained above.

Because the system is attempting to switch the state of the cross-coupled inverters 4 and 6, a conflict arises, at least temporarily, within cell 2. Specifically, because the output of inverter 4 is held at 0, it is difficult to switch the value on the right side of the cell to Vdd, especially given that the level transferred from bit line 16 is only Vdd-Vt. The problem is compounded because of the high static noise margins employed to keep the values on SRAM cells stable. Because of these effects, it is virtually impossible to switch the state of the right side of cross-coupled inverters 4 and 6 from low to high by simply applying a high value to bit line 16. The solution is to force a 0 (low) on the other side of the memory cell. As two complementary values (high and low) are written into the cell, two complementary bit lines are necessary to make the operations possible. To effect the transition, bit lines 16 and 14 must "push and pull" at the same time.

In this 6-transistor cell, it is impossible to use two ports at the same time as they share a word line and bit lines. That is, both bit lines and the word line must participate in any read or write operation. Thus, the ports must be selected one after the other, thereby reducing the available speed by a factor of 2. Further such access requires peripheral arbitration logic in order to handle the different selections. Such extra logic complicates the device design.

A standard 8-transistor DPSRAM cell 21 is depicted in FIG. 2. Such cells are commonly used in FIFOs and other applications. Cell 21 includes cross-coupled inverters 23 and 25 arranged in the same manner as inverters 4 and 6 in cell 2. This cell includes two "true" ports. A first port is controlled by a word line 27 in conjunction with bit lines 29 and 31. Word line 27 controls the gates of two NMOS access transistors 33 and 35. A second port is controlled by a word line 37 and bit lines 39 and 41. Word line 37 controls the potential on the gates of two NMOS access transistors 43 and 45. As shown, access transistors 33 and 35 of the first port are arranged at opposite sides of cell 21 and NMOS access transistors 43 and 45 of the second port are also arranged at opposite sides of the cell.

In operation, cell 21 acts much like cell 2, except that because it is controlled by two "true" ports, each with its own compliment of a word line, two bit lines, and two access transistors, it can be accessed through each port nearly simultaneously. In stand-by mode, word lines 27 and 37 are held at a low level. During read or write through the first port, word line 27 is set to a high level (e.g., Vdd). During a read operation through the first port, bit lines 29 and 31 are precharged to Vdd/2 and then, after word line 27 is set high, their outputs are ready by an SRAM sensing circuit and compared. During a write operation, cross-coupled inverters 23 and 25 are pushed and pulled simultaneously by applying complementary values on bit lines 29 and 31 while word line 27 is held high. The second port operates in essentially the same manner. During read, bit lines 39 and 41 are precharged to Vdd/2. Then, when word line 37 is set high, the values on word lines 39 and 41 (now affected by the internal value stored on the cross-coupled inverters) are compared by a sensing circuit. Finally, during the write operation through the second port, complementary values are applied to bit lines 39 and 41 while word line 37 is set high.

While this 8-transistor cell has found wide application, its major problem is the large are that it occupies. It requires six N channel transistors, two P channel transistors, and four metal bit lines running on top of the cell.

Other multiport cells have the same issues. In fact, they can be even more difficult to implement because, in general, the static noise margin is intentionally increased to compensate for the effects of additional access modes. So large cell size becomes the only known option.

For the above reasons an improved high density SRAM is needed.

SUMMARY OF THE INVENTION

The present invention provides an improved SRAM cell. The cell may be written to by controlling the potential on a single bit line only. For example a true dual port cell (in which the two ports may be accessed nearly simultaneously without needing peripheral arbitration logic) might employ two cross-coupled inverters, two bits lines, two word lines, and two access transistors. The SRAM cells of this invention employ at least one internal "pseudo inverter" which can be independently powered on and off. By powering it off during the write operation, the internal conflict associated with changing the value of a stored bit is avoided, or at least greatly mitigated.

One aspect of the invention provides a multiport SRAM cell. It may be characterized by the following features: (a) at least two ports; (b) at least two cross-coupled CMOS pseudo inverters arranged such that a first CMOS inverter has its input oriented to receive signals from a first port and a second CMOS inverter has its input oriented to receive signals from a second port; and (c) a pseudo ground line or a pseudo power line coupled to a ground or power connection for one of the first and second CMOS inverters, thereby allowing the first or second CMOS inverter to be powered on and off by controlling the potential on the pseudo ground line or pseudo Vdd line.

In this design, the pseudo inverter may be powered on and off by providing control over either the Vdd or ground input to the appropriate source/drain of the series transistors. This may be accomplished by providing either a "pseudo-ground" or a "pseudo-Vdd" to the pseudo-inverter. For example an N channel transistor's source may be connected to an independently controllable local "pseudo ground line." Such pseudo ground line can hold the N channel source at ground (low) during standby mode (i.e., while holding a bit value). Then during a write operation, if it would conflict with the write operation, it can be turned off by raising its pseudo ground line to high. This allows the bit value of the SRAM cell to be switched more easily than in the conventional 6-transistor cell design described above. In fact, it can be switched by controlling only a single bit line, thereby freeing the second bit line for independent access.

Typically at least one of the two ports will include an access transistor, a word line, and a bit line. Preferably, the first port includes a first word line and the second port includes a second word line configured such that the first and second word lines are separately controllable. That is, a separate word line may be provided for each access transistor. Typically, the SRAM will be connected to circuitry which controls the potential on the pseudo ground line or pseudo power line such that the second CMOS inverter is turned off during a write operation through the first port.

Another aspect of the invention provides an SRAM memory system that may be characterized as including the following features: (a) a plurality of multiport SRAM cells as described above; (b) control circuitry which controls the potential on the pseudo ground line or pseudo power line such that the second CMOS inverter is turned off during a write operation through the first port; (c) a first bit line connected to the first ports of a plurality of the multiport SRAM cells; and (d) a sense amplifier connected to the first bit line to allow reading of values stored on the plurality of multiport SRAM cells.

Another aspect of the invention provides a method of wiring a value to a multiport SRAM cell. The method may be characterized as including the following sequence: (a) putting a high value on a bit line; (b) providing a conductive path between the bit line and a first port of the SRAM cell; and (c) turning off an inverter within the SRAM cell, which inverter has an output connected to the first port, thereby allowing the high value to be introduced to the SRAM cell. Following this, the control circuitry may turn the inverter back on to confirm the that the high value has been written to the cell. Thereafter, the control circuitry may block the conductive path from the SRAM cell to the bit line. The conductive path may be provided and blocked by turning on and off an access transistor between the bit line and the first port of the SRAM cell. As should be apparent from the above discussion of SRAM cells, the SRAM cell used in this method will typically include a second inverter which remains on while the first inverter is turned off during a write operation.

In this method, the inverter may be turned off by putting a high value on a pseudo ground line coupled to the inverter. Similarly, the inverter may be turned off by putting a low value on a pseudo power line coupled to the inverter.

These and other features and advantages of the invention will be described below in the Detailed Description section with reference to the appended drawings.

DETAILED DESCRIPTION OF THE PREFERRED EMBODIMENTS

The invention will be described with reference to certain preferred embodiments set forth below. Specifically, the invention will be described with reference to a particular 6-transistor SRAM cell design and a few variants. It should be understood that the invention is in no way specifically limited to these embodiments. For example, while that SRAM cell design is presented as a dual-port cell, the principles of this invention can be extended to multiport cells.

Figure 3:
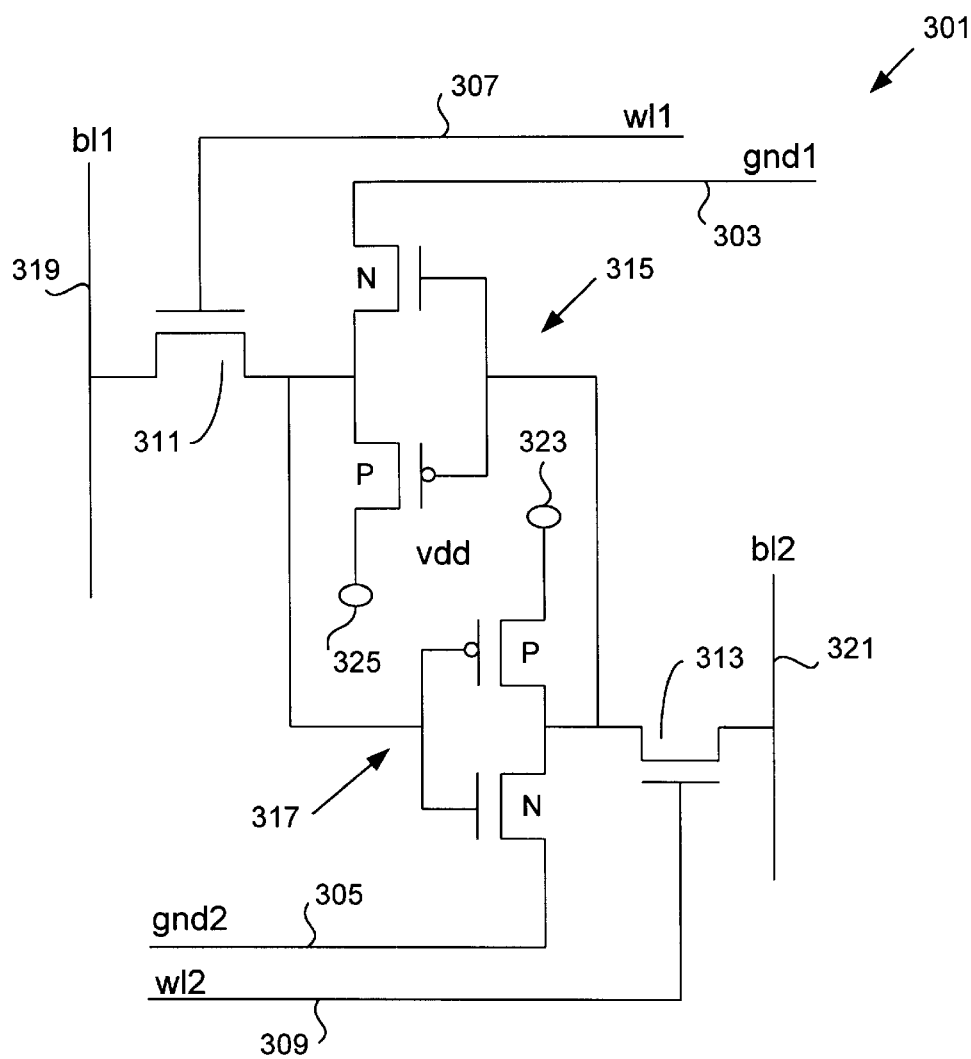
FIG. 3 provides a schematic illustration of a 6-transistor SRAM cell in accordance with one embodiment of this invention.

FIG. 3 illustrates a 6-transistor dual port SRAM cell 301 in accordance with one embodiment of this invention. At the outset, it is worth noting that the cell includes pseudo ground lines 303 and 305 and a separate word line 307 and 309 for each of two access transistors 311 and 313. The pseudo ground lines are not connected to a general ground such as the substrate or a Vss contact. Instead they are connected to separate command lines which allow independent control of two ports.

As shown in FIG. 3, SRAM cell 301 includes two cross-coupled internal inverters 315 and 317. The input to inverter 317 is provided through access transistor 311 coupled to a bit line 319 and controlled by word line 307. The input to inverter 315 is provided through access transistor 313 coupled to bit line 321 and controlled by word line 309.

Inverter 315 is coupled to a Vdd connection 325 through its P channel transistor and to pseudo ground line 303 through its N channel transistor. Similarly, inverter 317 us coupled to a Vdd connection 323 through its P channel transistor and to pseudo ground line 305 through its N channel transistor. The pseudo ground lines may be implemented as command lines (like word lines) and are normally set to "0" and so act like ground and can be used to power inverter circuits. However, the pseudo ground lines may also be shifted to "1" (Vdd) and thereby turn off of the corresponding internal inverter circuit.

Figure 1:
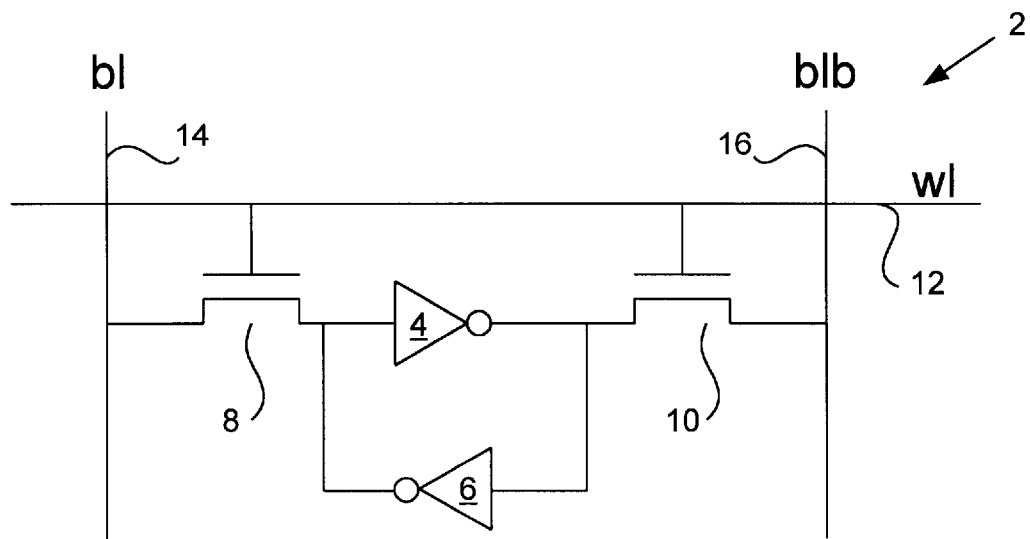
FIG. 1 provides a schematic illustration of a standard 6-transistor dual-port SRAM cell.
Figure 2:
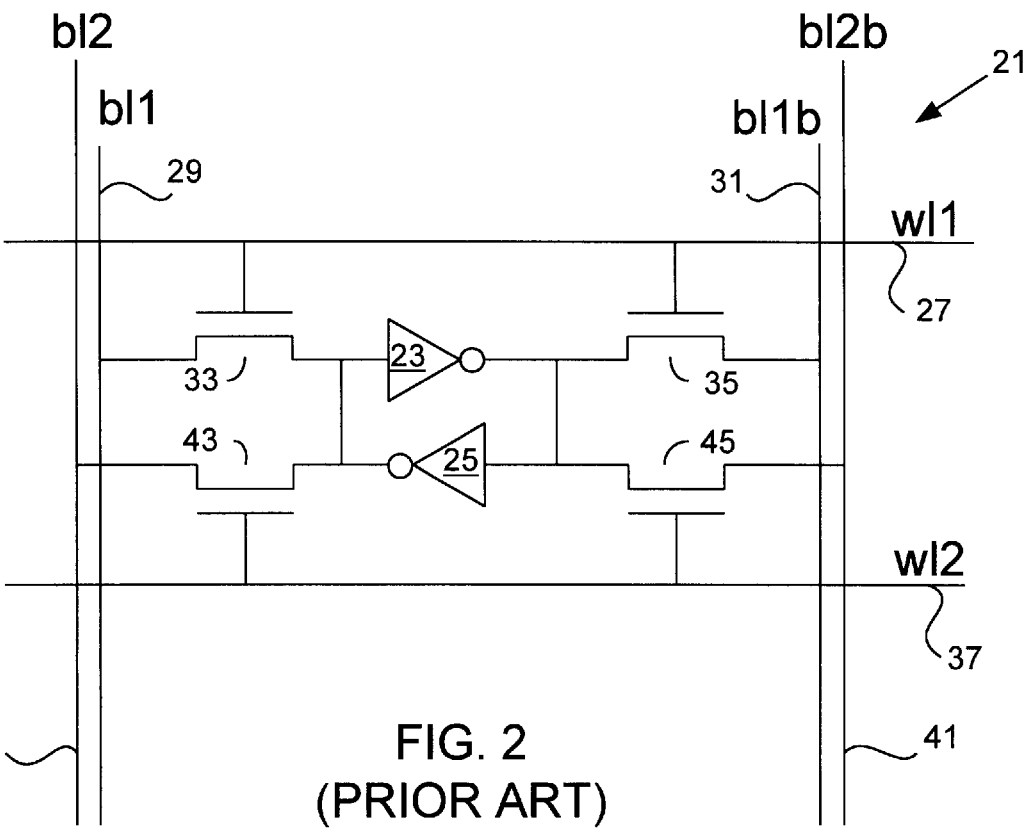
FIG. 2 provides a schematic illustration of a standard 8-transistor dual-port SRAM cell.

Because inverter 315 can be turned off during a write operation through a first port (including bit line 319, word line 307, and access transistor 311), the conflict between writing a new value and maintaining an old value with inverter 315 is eliminated. Thus, a value of "1" an be forced through access transistor 311 without involving the second port (including bit line 321, word line 309, and access transistor 313), even when a "0" is stored on the left side of cell 301. Likewise a "1" can be forced through access transistor 313 without involving the first port, so long as internal inverter 317 is turned off prior to the write operation. As mentioned, two ports must be involved to write a "1" over a "0" in conventional cells such as those depicted in FIGS. 1 and 2. One port is required to push and the other to pull the "1" in because these cells have no mechanism to selectively and temporarily turn off an inverter.

In standby mode, the two word lines 307 and 309 are held low, thereby preventing access to SRAM cell 301. The two pseudo ground lines 303 and 305 are also held low, thereby providing power to operate inverters 315 and 317. In this mode, no information can enter SRAM cell 301 and cross-coupled inverters 315 and 317 are in a stable logical state.

Figure 4:
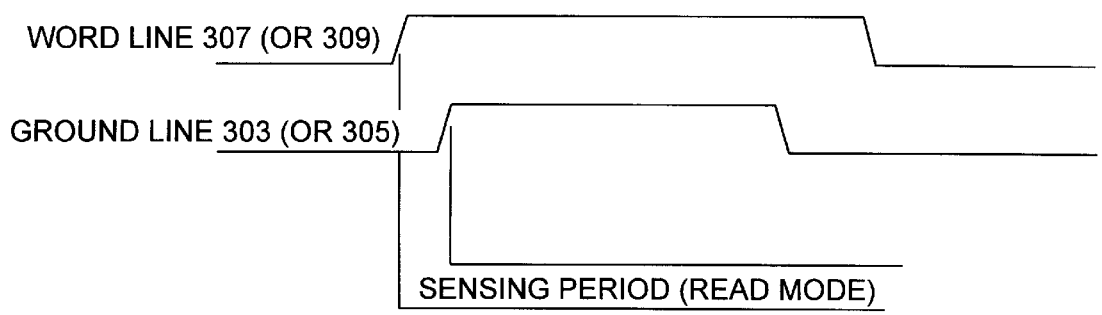
FIG. 4 provides a timing diagram for writing to and reading from an SRAM cell as shown in FIG. 3.

In the write mode, one port is active. This is accomplished by raising its word line to the "high" level and then raising the corresponding pseudo ground line signal to the high level as indicated in the timing diagram shown in FIG. 4. This turns on the access transistor (transistor 311 or 313) and turns off the corresponding inverter (inverter 315 or 317) as it is not powered. These combined actions prevent the conflict between the stored signal and the new signal as described above. Now either a "low" or a "high" signal can enter memory cell 301 and switch the second inverter (which is still powered on because its pseudo ground line is maintained at ground). At the conclusion of the write access, the pseudo ground line returns to low and shortly thereafter the word line returns to the deselected state as indicated in FIG. 4. The first inverter operates again and confirms the data proposed by the second one.

For example, suppose that a 0 value is stored on the left side of cell 301 and a 1 is to be written through the first port. To accomplish this word line 307 is set high to allow access through access transistor 311. Then pseudo ground line 303 is set high to turn off internal inverter 315 and diminish the strength of the 0 signal at the first port. At some point in this process, the potential on bit line 319 is set high (e.g., Vdd), thereby allowing a 1 to be fed to the input of internal inverter 317. The output of inverter 317 is now zero and the new bit value has been entered in cell 301. At this point, inverter 315 may be powered on by returning pseudo ground line 303 to low. This sets the output of inverter 315 to 1, thereby confirming the 1 value that has been written via the first port. Finally, word line 307 is returned to low, thereby blocking access through transistor 311 and decoupling SRAM cell 301 from bit line 319.

It is possible to simultaneously access the two ports—at the same address, row and column. However, care must be taken—as will all multiport cells—to avoid racing conditions between the two ports' peripheral logic circuitry.

In the read mode, one port is active. As with the write mode, this may be accomplished by raising its word line to the "high" level and then raising the corresponding pseudo ground line signal to the high level as indicated in the timing diagram shown in FIG. 4. The only difference is the state of the bit line through the read signal is to be transmitted. In the write mode, the bit line is forced to a logical state—to be transferred into the cell during the access—while in the read mode the bit line remains at a high impedance (e.g., Vdd/2) to allow transmission of the small amount of information from the cell.

Of course it is possible to allow both internal inverters to remain powered on during the read operation. This is a second embodiment of the invention. In some systems, however, it may be desirable to use the same controls for both the read and write operations in order to simply design. Because one internal inverter must be turned off during write mode, the read and write modes can be made symmetrical by requiring that one inverter also be turned off during read. In this embodiment, the device providing the information is the internal inverter corresponding to the port through which the information is read. Because this circuit is turned off almost simultaneously with the read access, only a small transient signal is provided to the bit line.

In the embodiment where only a single inverter remains powered on during the read operation, a conventional SRAM voltage or current sensing technique might not always be desired. This is because the signal persists on only a single bit line and conventional SRAM sensing techniques often compare the outputs from two bit lines. Therefore, in some embodiments of this invention, the signals output by the SRAM cells may be treated in the same manner as DRAM signals which are read from a single bit line. For example, signals from the SRAM cell could be read by a sense amplifier. In fact, it may be desirable to employ other features of DRAMs in SRAM arrays of this invention. For example, the SRAM cells could be periodically refreshed by a latch-based sense amplifier. If a DRAM-type refresh is performed, the end of the read access is identical to the write access described above (i.e., the ground is returned to low and the word line access is turned off) as illustrated in FIG. 4.

In an alternative embodiment, the power to the cross-coupled inverters is controlled through pseudo-Vdd lines rather than a pseudo ground lines. By controlling the potential on the pseudo-Vdd lines, the inverters can be powered on and off. To turn off an inverter, the potential on a pseudo-Vdd line is set to a low level. To turn on the inverter, the potential on the pseudo-Vdd line is set to a high level (Vdd). Of course, it is possible that a cell could be designed to include both pseudo-Vdd and pseudo-ground lines to the inverter.

In summary, the present invention provides a multi-port CMOS SRAM cell having pseudo inverters which can be powered off in order to allow write operations through only a single port. In a preferred implementation, the cell is a dual-port cell having only six transistors. The layout of this cell is as dense as that of a standard 6-T single port cell. Because the memory cells of this invention have the same dimensions as the standard memory cells, they can share decoders (using the same pitch) without wasting area. This is very useful for associative cache memories. Further, the two ports employed in SRAM cells of this invention do not share resources (word lines or bit lines) allowing them to work simultaneously, thus allowing them to work at maximum frequency. Still further, there is no need for external arbitration logic (other than for forbidding simultaneous access at the same address), thereby reducing the complexity and area required for port peripheral logic.

Figure 5:
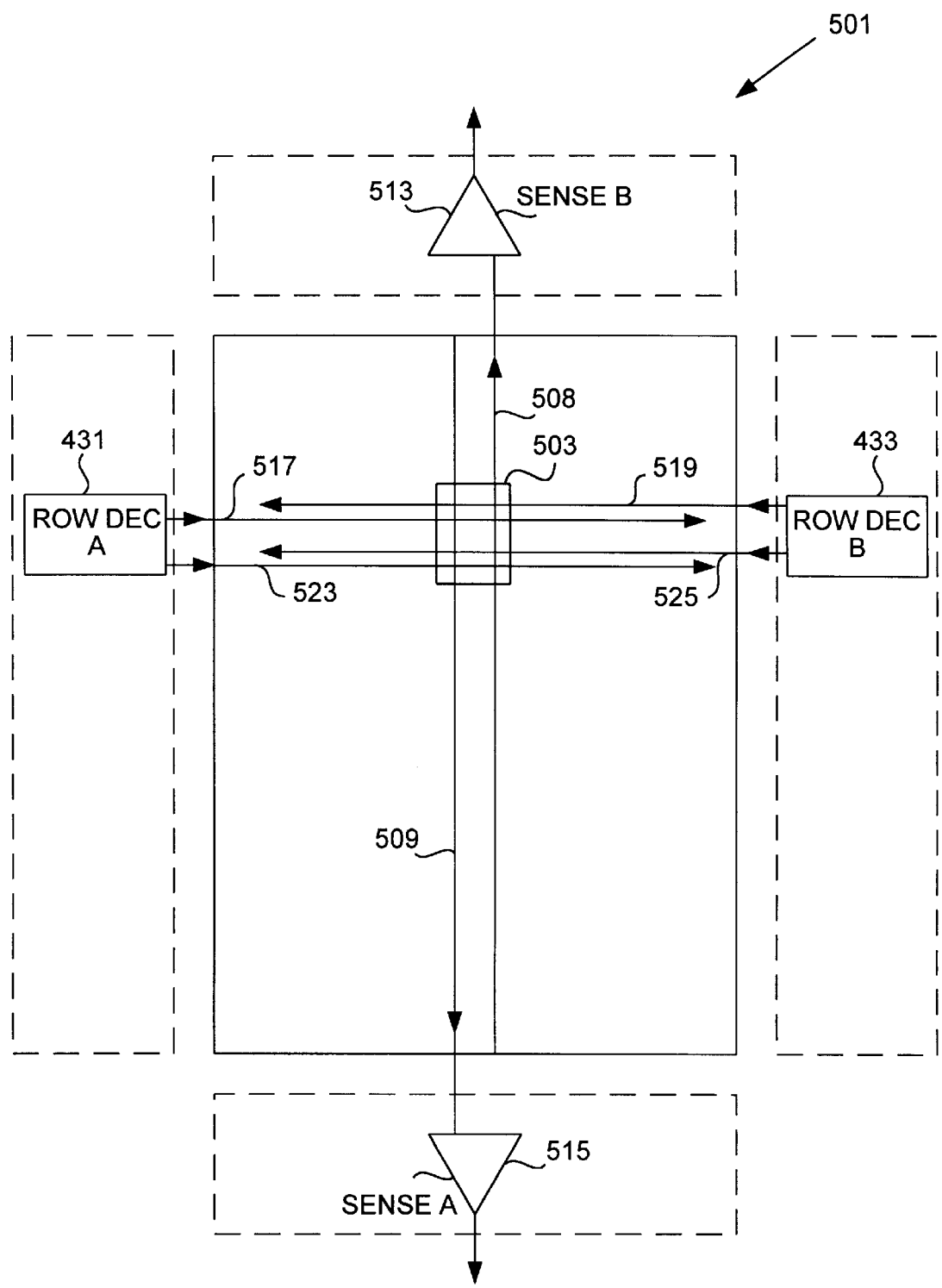
FIG. 5 provides a block diagram of an array or system including a plurality of SRAM cells of this invention.

FIG. 5 is a block diagram illustrating a system or memory array 501 including an array of SRAM cells designed in accordance with this invention. As shown, a column of SRAM cells including a cell 503. The SRAM cells of this column share two bit lines 508 and 509, one for the first ports of the cells and one for the second ports of the cells. Other columns include identical collections of SRAM cells and bit lines. The bit lines are each connected to a dedicated sense amplifier. Bit line 508 is connected to a sense amplifier 513 and bit line 511 is connected to a sense amplifier 515. Word lines control the access transistors of the various ports. For example, word lines 517 and 519 control the access transistors to the ports of cell 503 (as well as other cells on the same row—not shown). The cells will also include power or ground lines, two to a cell. As shown, cell 503 has a pair of ground lines 523 and 525 (which feed other cells on the same row). Wordline 517 and ground line 523 are controlled by a row decoder 431 for one port of cell 503 and the other cells on the same row. Wordline 519 and ground line 525 are controlled by a row decoder 433 for the other port of cell 503. Note that in this layout, a first port is controlled from the left and bottom of the matrix, while a second port is controlled from the top and right of the matrix.

Figure 6:
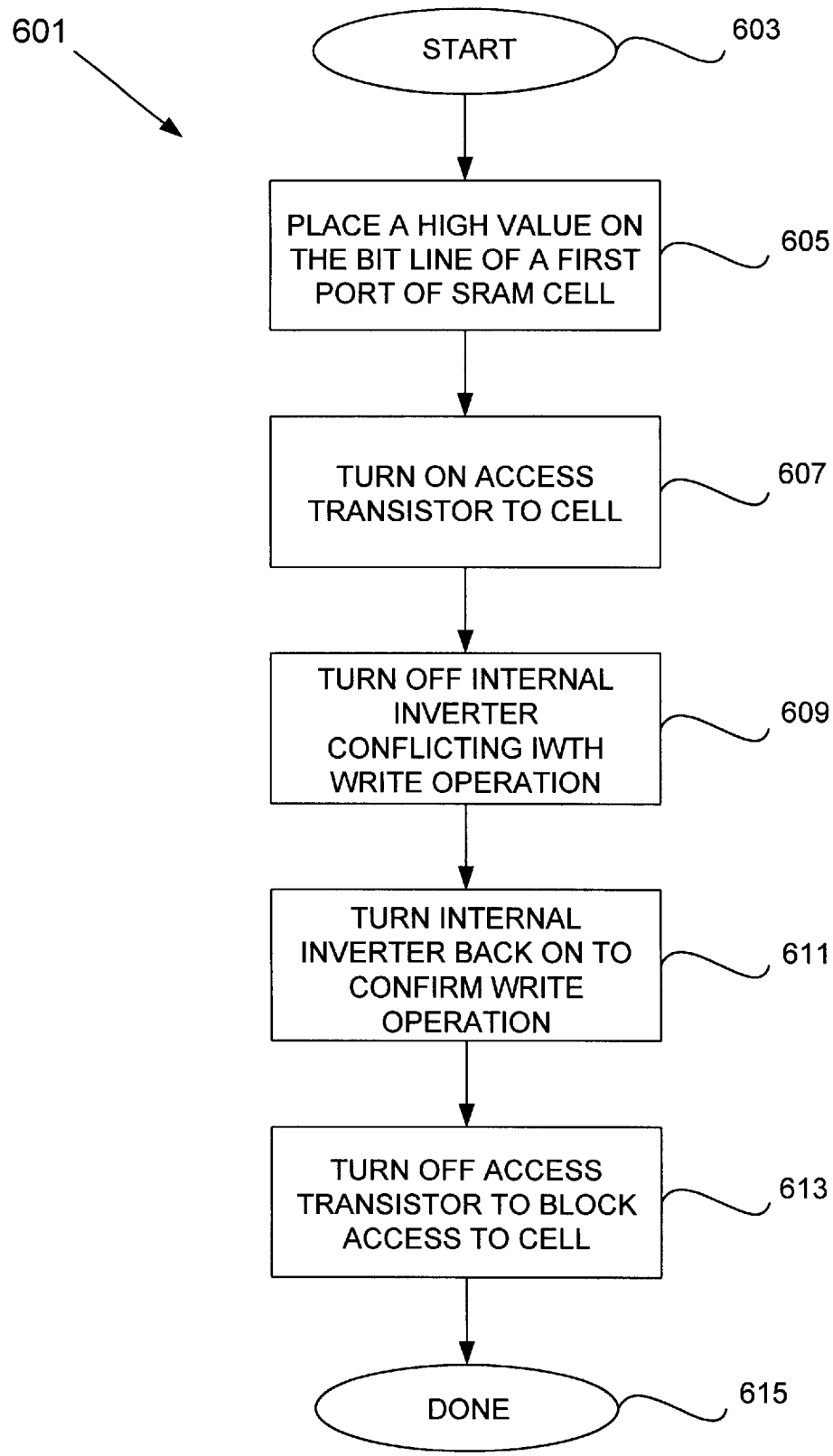
FIG. 6 provides a method flow chart illustrating the steps that may be employed to write a high value through a first port of an SRAM cell in accordance with this invention.

The operation of SRAM cells in accordance with this invention may be represented by a sequence of method steps. This is presented in FIG. 6 which depicts a method 601. The process begins at 603 and in a step 605 the control logic puts a high value on the bit line connected to a first port of the cell under consideration. Then at a step 607, the access transistor to the first port is turned on to provide a conductive path between the bit line and the inverters of the cell. This allows the high value on the bit line to be provided to the cell, but it may result in a conflict if a zero is currently stored at the first port. To address this problem, the method next requires that the internal inverter providing the potentially conflicting value be turned off at a step 609. This allows the high value to be written through the first port without significant conflict. Then to confirm the write operation, the inverter which was turned off is now turned back on at a step 611. Finally, at a step 613, the access transistor is switched off to protect the content of the SRAM cell. The process is concluded at 615.

Although the foregoing invention has been described in some detail for purposes of clarity of understanding, it will be apparent that certain changes and modifications may be practiced within the scope of the appended claims. For example, while the specification has described certain embodiments which accomplish the objectives of the present invention, many others which will be understood by those of skill in the art from the present disclosure to be within the spirit of the present invention may also be used. Therefore, the present embodiments are to be considered as illustrative and not restrictive, and the invention is not to be limited to the details given herein, but may be modified within the scope of the appended claims.

What is claimed is:

1. A multiport SRAM cell comprising:
   at least two ports;
   at least two cross-coupled inverters wherein a first inverter has its input coupled to receive signals from a first port and a second inverter has its input coupled to receive signals from a second port; and
   a pseudo ground line or a pseudo power line coupled to a ground or power connection of one of the first and second inverters, thereby allowing the first or second inverter to be powered on and off by controlling the potential on the pseudo ground line or pseudo power line.

2. The SRAM cell of claim 1, wherein the multiport SRAM cell is a dual port SRAM cell.

3. The SRAM cell of claim 1, wherein at least one of the two ports comprises an access transistor, a word line, and a bit line.

4. The SRAM cell of claim 1, wherein the first port comprises a first word line and the second port comprises a second word line, and wherein the first and second word lines are separately controllable.

5. The SRAM cell of claim 1, wherein the pseudo ground line is connected to the first inverter.

6. The SRAM cell of claim 1, wherein the pseudo power line is connected to the first inverter.

7. The SRAM cell of claim 1, further comprising circuitry which controls the potential on the pseudo ground line or pseudo power line such that the second inverter is turned off during a write operation through the first port.

8. The SRAM cell of claim 1, wherein the first and second inverters each comprise a CMOS inverter.

9. An SRAM memory system comprising:
   (a) a plurality of multiport SRAM cells each comprising:
      (i) at least two ports;
      (ii) at least two cross-coupled inverters wherein a first inverter has its input coupled to receive signals from a first port and a second inverter has its input coupled to receive signals from a second port; and
      (iii) a pseudo ground line or a pseudo power line coupled to the second inverter for turning off and on the second inverter;
   (b) control circuitry coupled to the pseudo ground line or the pseudo power line for controlling the potential on the pseudo ground line or pseudo power line such that the second inverter is turned off during a write operation through the first port;
   (c) a first bit line coupled to the first ports of the plurality of multiport SRAM cells; and
   (d) a sense amplifier coupled to the first bit line for reading a value stored on a one of the plurality of multiport SRAM cells.

10. The SRAM memory system of claim 9, wherein the pseudo ground line or the pseudo power line is coupled to a ground or power connection of the second inverter thereby allowing the second inverter to be powered on and off by controlling the potential on the pseudo ground line or pseudo power line.

11. The SRAM memory system of claim 10, wherein the pseudo ground line is connected to the second inverter.

12. The SRAM memory system of claim 10, wherein the pseudo power line is connected to the second inverter.

13. The SRAM memory system of claim 10, wherein the SRAM cell further comprises a pseudo ground line or a pseudo power line for turning off and on the first inverter independently of the second inverter, and wherein the control circuitry also controls the potential on the pseudo ground line or pseudo power line of the first inverter such that the first inverter is turned off during a write operation through the second port.

14. The SRAM memory system of claim 9, wherein the multiport SRAM cells are dual port SRAM cells.

15. The SRAM memory system of claim 9, wherein at least one of the two ports comprises an access transistor and a word line.

16. The SRAM memory system of claim 9, wherein the first port comprises a first word line and the second port comprises a second word line, and wherein the first and second word lines are separately controllable.

17. The SRAM memory system of claim 9, wherein the first and second inverters each comprise a CMOS inverter.

18. A method of writing a value to a multiport SRAM cell, the method comprising:

putting a first high value on a bit line;

providing a conductive path between the bit line and a first port of the SRAM cell; and turning off an inverter within the SRAM cell, which inverter has an output connected to the first port, thereby allowing the high value to be introduced to the SRAM cell.

19. The method of claim 18, further comprising:

turning the inverter back on after the high value is introduced to the SRAM cell; and blocking the conductive path from the SRAM cell to the bit line.

20. The method of claim 18, wherein the conductive path is provided by turning on an access transistor between the bit line and the first port of the SRAM cell.

21. The method of claim 18, wherein the inverter is turned off by putting a second high value on a pseudo ground line coupled to the inverter.

22. The method of claim 18, wherein the inverter is turned off by putting a low value on a pseudo power line coupled to the inverter.

23. The method of claim 18, wherein the SRAM cell also comprises an additional inverter which remains on while the inverter is turned off.

24. The method of claim 18, further comprising periodically refreshing the SRAM cell.

25. The method of claim 18, wherein the inverter comprises a CMOS inverter.

* * * * *